United States Patent [19]

Namba et al.

[11] Patent Number: 5,849,457
[45] Date of Patent: Dec. 15, 1998

[54] POSITIVE-WORKING QUINONEDIAZIDE SULFONIC ACID ESTER RESIST COMPOSITION UTILIZING SOLVENT SYSTEM INCLUDING 2-HEPTANONE, ETHYL LACTATE, AND γ-BUTYROLACTONE

[75] Inventors: Katsuhiko Namba, Ibaraki; Kaoru Tatekawa, Osaka; Hiroshi Moriuma, Nara; Yasunori Uetani, Toyonaka, all of Japan

[73] Assignee: Sumitomo Chemical Company, Limited, Osaka, Japan

[21] Appl. No.: 959,294

[22] Filed: Oct. 24, 1997

Related U.S. Application Data

[63] Continuation of Ser. No. 647,106, May 9, 1996, abandoned.

[30] Foreign Application Priority Data

May 9, 1995 [JP] Japan ................................. 7-110414

[51] Int. Cl.⁶ ........................... G03F 7/023; G03C 1/61
[52] U.S. Cl. ........................................ 430/191; 430/192
[58] Field of Search ............................................ 430/193

[56] References Cited

U.S. PATENT DOCUMENTS

| | | | |
|---|---|---|---|
| 5,059,507 | 10/1991 | Uetani et al. | 430/192 |
| 5,275,910 | 1/1994 | Moriuma et al. | 430/192 |
| 5,283,155 | 2/1994 | Uetani et al. | 430/192 |
| 5,290,656 | 3/1994 | Uetani et al. | 430/165 |
| 5,326,665 | 7/1994 | Osaki et al. | 430/192 |
| 5,336,583 | 8/1994 | Uetani et al. | 430/191 |
| 5,407,778 | 4/1995 | Uetani et al. | 430/192 |
| 5,407,779 | 4/1995 | Uetani et al. | 430/192 |
| 5,413,895 | 5/1995 | Tomioka et al. | 430/192 |
| 5,424,167 | 6/1995 | Uetani et al. | 430/192 |
| 5,429,904 | 7/1995 | Nagase et al. | 430/192 |
| 5,436,107 | 7/1995 | Tomioka et al. | 430/192 |
| 5,451,484 | 9/1995 | Nagase et al. | 430/192 |
| 5,468,590 | 11/1995 | Hashimoto et al. | 430/192 |
| 5,529,880 | 6/1996 | Zampini et al. | 430/192 |
| 5,556,734 | 9/1996 | Yamachika et al. | 430/192 |

FOREIGN PATENT DOCUMENTS

| | | |
|---|---|---|
| 0510670 | 10/1992 | European Pat. Off. . |
| 0510671 | 10/1992 | European Pat. Off. . |
| 0539778 | 5/1993 | European Pat. Off. . |
| 0571989 | 12/1993 | European Pat. Off. . |
| 322618 | 3/1991 | Japan . |
| 4-241353 | 8/1992 | Japan . |
| 4-362645 | 12/1992 | Japan . |
| 4-368950A | 12/1992 | Japan . |
| 5-150450 | 6/1993 | Japan . |

*Primary Examiner*—Christopher G. Young
*Attorney, Agent, or Firm*—Birch, Stewart, Kolasch & Birch, LLP

[57] ABSTRACT

A positive-working resist composition comprising (A) a quinonediazide compound, (B) an alkali-soluble resin, and (C) a solvent system comprising 2-heptanone, ethyl lactate and γ-butylactone in which the quinonediazide compound exhibits a very high solubility and which characteristics such as sensitivity, profile and coatability are excellent.

4 Claims, 1 Drawing Sheet

POSITIVE-WORKING QUINONEDIAZIDE SULFONIC ACID ESTER RESIST COMPOSITION UTILIZING SOLVENT SYSTEM INCLUDING 2-HEPTANONE, ETHYL LACTATE, AND γ-BUTYROLACTONE

This application is a continuation of application Ser. No. 08/647,106 filed on May 9, 1996, now abandoned.

The present invention relates to a positive-working resist composition comprising a quinonediazide compound, an alkali-soluble resin and a specific solvent system.

Positive-working resist compositions are usually produced by dissolving a quinonediazide compound and an alkali-soluble resin in a solvent. They are used in the manufacture of integrated circuits where they are coated on a substrate such as a silicon wafer and then subjected to exposure. The development of microminiaturization due to the on-going progress in high-integration observed in recent years has created a situation where half-micron patterns are required for integrated circuits. It is now necessary that positive-working resist compositions exhibit better characteristics such as good resolution, γ value, heat resistance, profile and coatability as well as give better process margins such as exposure margin and depth of focus.

Hitherto, as solvents for resists, cellosolve compounds have been commonly used. However, due to safety and health problems which these compounds create, it has been proposed to substitute them with other solvents such as propyleneglycolmonomethylether acetate, cyclohexanone, ethyl lactate and 2-heptanone. However, propyleneglycolmonomethylether acetate and cyclohexane tend to lower the heat resistance of resists. Ethyl lactate causes coatability-related problems such as larger striations or difficulty in coating edges of wafers, because of high viscosity. 2-Heptanone makes the solubility of certain quinonediazine compounds lower than the solubility when a cellosolve compound is used.

An object of the present invention is to solve the above-mentioned problems of conventional solvent for resist compositions and to provide a positive-working resist composition using a solvent in which quinonediazide compounds exhibit a good solubility and which is excellent in characteristics such as profile, coatability and heat resistance.

In order to solve the above-mentioned problems, the present invention provides a positive-working resist composition comprising a quinonediazide compound (A), an alkali-soluble resin (B) and a solvent system (C) comprising 2-heptanone, ethyl acetate and γ-butyrolactone.

The quinonediazide compound used as a component (A) can usually be a quinonediazidesulfonic acid ester, in particular, an o-quinonediazidesulfonic acid ester, of compounds having phenolic hydroxyl groups. The corresponding o-quinonediazidesulfonic acid includes, for example, 1,2-benzoquinonediazide-4-sulfonic acid, 1,2-naphthoquinonediazide-4-sulfonic acid and 1,2-naphthoquinonediazide-5-sulfonic acid. The o-quinonediazidesulfonic acid ester can generally be produced by a condensation reaction of a compound having phenolic hydroxyl groups with an o-quinoneazidesulfonic halide in the presence of an organic or inorganic base.

The compound having phenolic hydroxyl groups which is used for the production of a quinonediazide compound includes, for example, one of those mentioned as follows:

a polyhydric phenol such as hydroquinone, resorcin, phloroglucin, gallic alkylester;

a hydroxybenzophenone compound represented by the following general formula (I):

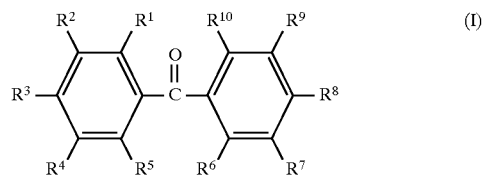

wherein two groups among $R^1$, $R^2$, $R^3$, $R^4$, $R^5$, $R^6$, $R^7$, $R^8$, $R^9$ and $R^{10}$ represent a hydroxyl group and the others each independently represent a hydrogen atom or a hydroxyl group;

a hydroxyhexahydroxanthene compound represented by the following general formula (II):

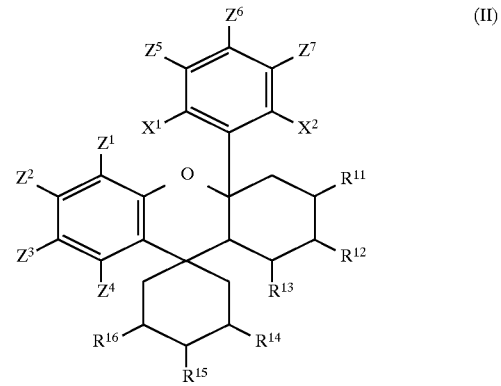

wherein one group among $X^1$ and $X^2$ represents a hydroxyl group and the other represents a hydrogen atom, a hydroxyl group or an alkyl group having 1–4 carbon atoms; two groups among $Z^1$, $Z^2$, $Z^3$, $Z^4$, $Z^5$, $Z^6$ and $Z^7$ represent a hydroxyl group and the others each independently represent a hydrogen atom, a hydroxyl group or an alkyl group having 1–4 carbon atoms; $R^{11}$, $R^{12}$, $R^{13}$, $R^{14}$, $R^{15}$ and $R^{16}$ each independently represent a hydrogen atom, an alkyl group having 1–10 carbon atoms, an alkenyl group having 2–4 carbon atoms, a cycloalkyl group having 5–8 carbon atoms or an aryl group;

a hydroxyflavan compound represented by the following general formula (III):

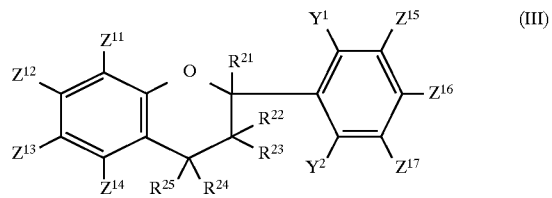

wherein one group among $Y^1$ and $Y^2$ represents a hydroxyl group and the other represents a hydrogen atom, a hydroxyl group or an alkyl group of 1–4 carbon atoms; two groups among $Z^{11}$, $Z^{12}$, $Z^{13}$, $Z^{14}$, $Z^{15}$, $Z^{16}$ and $Z^{17}$ represent a hydroxyl group and the others each independently represent a hydrogen atom, a halogen atom, a hydroxyl group, an alkyl group having 1–4 carbon atoms, a cycloalkyl group having 5–8 carbon atoms or an aryl group; $R^{21}$, $R^{22}$ and $R^{23}$ each independently represent a hydrogen atom, an alkyl group having 1–10 carbon atoms, an alkenyl group having 2–4 carbon atoms, a cyclohexyl group or an aryl group; one group among $R^{24}$ and $R^{25}$ represents an alkyl group having 1–10 carbon atoms, an alkenyl group having 2–4 carbon atoms, a cyclohexyl group or an aryl group, and the other represents an hydrogen atom, an alkyl group having 1–10 carbon atoms, an alkenyl group having 2–4 carbon atoms, a cyclohexyl group or an aryl group; and a hydroxydiphenylmethane compound represented by the following general formula (IV):

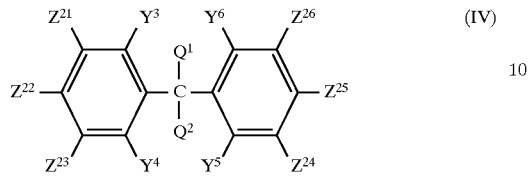

wherein one group among $Y^3$, $Y^4$, $Y^5$ and $Y^6$ represents a hydroxyl group and the others each independently represent a hydrogen atom, a halogen atom, a hydroxyl group or an alkyl group having 1–4 carbon atoms; one group among $Z^{21}$, $Z^{22}$, $Z^{23}$, $Z^{24}$, $Z^{25}$ and $Z^{26}$ represent a hydroxyl group and the others each independently represent a hydrogen atom, a halogen atom, a hydroxyl group, an alkyl group having 1–4 carbon atoms or an aryl group; $Q^1$ and $Q^2$ each independently represent a hydrogen atom, an alkyl group having 1–4 carbon atoms, an alkenyl group having 2–4) carbon atoms, a cycloalkyl group having 5–8 carbon atoms, an alkoxy-group having 1–4 carbon-atoms or an aryl group, provided that, when at least one group among $Q^1$ and $Q^2$ is a hydrogen atom, the group denoted by $Z^{21}$, $Z^{23}$, $Z^{24}$ or $Z^{26}$ and adjacent to a hydroxyl group denoted by $Y^3$, $Y^4$, $Y^5$ or $Y^6$ is an alkyl or an aryl group.

The hydroxyhexahydroxanthene compounds represented by the above-mentioned general formula (II) and their quinonediazidesulfonic acid esters are described in more detail in JP-A-3-185447 (=U.S. Pat. No. 5,283,155); the hydroxyflavan compounds represented in the above-mentioned general formula (III) and their quinonediazidesulfonic acid esters are described in more detail in JP-A-2-84650 (=U.S. Pat. No. 5,059,507), JP-A-4-241353, JP-A-4-295472 (=EP-A-505,987), etc.; and hydroxydiphenylmethane compounds represented by the above-mentioned general formula (IV) and their quinonediazidesulfonic acid esters are described in more detail in JP-A-2-269351 (=U.S. Pat. No. 5,290,656).

The solvent system of the present invention exhibits higher performance with quinonediazidesulfonic acid esters of hydroxybenzophenone compounds represented by the above-mentioned general formula(I), among those of the above-described compounds having phenolic hydroxyl groups. As examples of the hydrobenzophenone compounds represented by the general formula (I), following can be mentioned:

dihydroxybenzophenonessuchas2,4-dihydroxybenzophenone;

trihydroxybenzophenones such as 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2, 3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone and 3,4,4'-trihydroxybenzophenone;

tetrahydroxybenzophenones such as 2,3,3',4'-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone and 2,3',5,5'-tetrahydroxybenzophenone;

pentahydroxybenzophenones such as 2,2',3,4,4'-pentahydroxybenzophenone, 2,2',3,4,5'-pentahydroxybenzophenone, 2,2',3,3',4-pentahydroxybenzophenone and 2,3,3',4,5'-pentahydroxybenzophenone; and hexahydroxybenzophenones such as 2,3,3',4,4',5'-hexahydroxybenzophenone and 2,2',3,3',4,5'-hexahydroxybenzophenone.

The alkali-soluble resin used as component (B) can be one of the resins commonly used in the field of resists which includes, for example, a polyvinylphenol or a novolak resin. Novolak resins are produced by condensing a compound having a phenolic hydroxyl group with an aldehyde according to a conventional method. The compound having a phenolic hydroxyl group which are used for producing novolak resins includes, for example, phenol, o-cresol, m-cresol, p-cresol, 2,5-xylenol, 3,5-xylenol, 3,4-xylenol, 2,3,5-trimethylphenol, 2-t-butylphenol, 3-t-butylphenol, 4-t-butylphenol, 2-ethylphenol, 3-ethylphenol, 4-ethylphenol, 2-t-butyl-4-methylphenol, 2-t-butyl-5-methylphenol, 2-cyclohexyl-5-methylphenol, hydroquinone, 2-t-butylhydroquenone, 2-naphthol, 1,3-dihydroxynaphthalene, 1,7-dihydroxynaphthalene and 1,5-dihydroxynaphthalene. They can be used individually or in combination of two or more. The aldehyde used for the production of novolak resins includes, for example, aliphatic aldehydes such as formaldehyde and acetaldehyde, and aromatic aldehydes such as benzaldehyde, o-hydroxybenzaldehyde, m-hydroxybenzaldehyde, p-hydroxybenzaldehyde, o-methylbenzaldehyde and p-methylbenzaldehyde. They can also be used individually or, if necessary, in combination of two or more.

It is preferred to use a novolak resin as an alkali-soluble resin in the resist composition of the present invention, and particularly the one in which the molecular weight is controlled through an operation such as fractionation after condensation is preferred. The preferred alkali-soluble resins are these having a gel permeation chromatogram (GPC pattern) (using a UV-254 nm detector) in which the areal % of pattern area corresponding to the polystyrene-converted molecular weight range of 900 or less is 25% or less based on the total pattern area. The more preferred resins are those having the same GPC pattern in which the areal % of pattern area corresponding to the polystyrene-converted molecular weight range of 6000 or less is from 40% to 65% based on the total pattern area, and particularly preferred is the resins having the same GPC pattern in which the areal % of pattern area corresponding to the polystyrene-converted molecular weight range of 6000 or less is from 50% to 65% based on the total pattern area.

The ratio of quinonediazide compound to alkali-soluble resin is preferably 1:1–1:7 by weight.

The solvent system C used in the present invention to dissolve the above-mentioned quinonediazide compounds and alkali-soluble resins is a mixed solvent comprising at least three ingredients: 2-heptanone, ethyl lactate and γ-butyrolactone. In these three ingredients constituting the solvent, it is preferred that the amount of γ-butyrolactone is 0.5% by weight or more, particularly preferably 1% by weight or more, and the amount of ethyl lactate is 1% by weight or more, particularly preferably 10% by weight or more on the basis of the total amount of the solvent system C. A content of γ-butyrolactone that is too low tends to reduce the improving effect on the profile; and a content of ethyl lactate that is too low tends to lower the solubility of a certain quinoneazide compound. It is preferred that the amount of 2-heptanone is 10% by weight or more on the basis of the total amount of the solvent system C, and it is particularly preferred that the total amount of 2-heptanone and ethyl lactate is 50% by weight or more on the basis of the total amount of the solvent system (C).

So far as it does not affect the favorable effects of the present invention, the solvent system (C) can contain another solvent. The another solvent includes, for example, an ester such as n-butyl acetate, an aromatic hydrocarbon such as toluene or xylene, a ketone such as methyl isobutyl ketone, acetone, 3-octanone or cyclohexanone, a glycol monoether such as 3-methoxybutanol or propylene glycol monomethylether, and a glycol ether ester such as 3-methoxybutyl acetate, propylene glycol monoethylether acetate or propylene glycol monomethylether acetate.

The solvent system (C) should be used in an appropriate amount so that a uniform coated film without pinholes or coating irregularities can be formed on a wafer or any other appropriate substrates. Although this amount is not particularly restricted, it is usually preferred to use the solvent system (C) in an amount so that the total concentration of the quinonediazide compound and the alkali-soluble resin ranges within 3–50 weight % on the basis of the total amount of the resist composition.

If necessary, the resist composition of the present invention can comprise sensitizers, other resins, alkali-soluble low molecular weight phenol additives, a surface-active agent, stabilizers, dyes to make the image formed more visible, and any other additives commonly used in this technical field.

The present invention will be described in more detail with reference to examples which, however, should not be construed to limit the invention. Unless otherwise noted, % and part representing contents and added amounts in the examples are on a weight basis.

EXAMPLES 1–7 AND COMPARATIVE EXAMPLES 1–6

A condensation reaction product produced by reacting 2,3,4,4'-tetrahydroxybenzophenone with 2-naphthoquinonediazide-5-sulfonic chloride in the molar ratio of 1:2.5, respectively was used as the quinonediazide compound. To 0.1 g of the quinonediazide compound thus obtained, a certain amount of each of the solvents (mixed or individual) shown in Table 1 was added and the resulting mixture was stirred for 24 hours. The solubility of the quinonediazide compound in each solvent was deduced from the amount of solvent added to dissolve the quinoneazide compound completely and then expressed as amount of quinoneazide compound dissolved in 100 g of each solvent (g/100 g-Solvent). The results are shown in Table 1. In the column of the solvent components, "2-HP" refers to 2-heptanone, "EL" to ethyl lactate, "GBL" to γ-butyrolactone and "ECA" to ethylcellosolve acetate. The same abbreviations are used in table 2.

TABLE 1

| Example No. | Solvent, Components and their Weight Ratio | Quinonediazide Compound Solubility (g/100 g-Solvent) |
| --- | --- | --- |
| Example 1 | 2-HP 90/EL 9.9/GBL 0.1 | 3 |
| Example 2 | 2-HP 90/EL 9.9/GBL 0.5 | 3 |
| Example 3 | 2-HP 90/EL 9/GBL 1 | 4 |
| Example 4 | 2-HP 90/EL 5/GBL 5 | 4 |
| Example 5 | 2-HP 92/EL 4/GBL 4 | 4 |
| Example 6 | 2-HP 93/EL 1/GBL 6 | 4 |
| Example 7 | 2-HP 92/EL 1/GBL 7 | 4 |
| Comparative example 1 | ECA 100 | 3 |
| Comparative example 2 | 2-HP 100 | 1 |
| Comparative example 3 | 2-HP 95/GBL 5 | 2 |
| Comparative example 4 | 2-HP 90/GBL 10 | 4 |
| Comparative example 5 | 2-HP 95/EL 5 | 2 |
| Comparative example 6 | 2-HP 90/EL 10 | 3 |

EXAMPLES 8–16 AND COMPARATIVE EXAMPLE 7

A mixture of a resin having a polystyrene-converted weight-average molecular weight of 8,000 (GPC areal % of the pattern area corresponding to polystyrene-converted molecular weight of 900 or less is 15%) obtained by fractionation of a novolak resin having a polystyrene-converted weight-average molecular weight of 4,400 which was prepared by a reaction of a mixture of m-cresol and p-cresol in the molar ratio of 1:1, respectively with formalin; and a resin having a polystyrene-converted weight-average molecular weight of 8,000 (GPC areal % of the pattern area corresponding to polystyrene-converted molecular weight of 900 or less is 15%) obtained by fractionation of a novolak resin having a polystyrene-converted weight-average molecular weight of 4,400 which was prepared by a reaction of a mixture of m-cresol, p-cresol and 2-t-butyl-5-methylphenol in the molar ratio of 20:20:1, respectively, with formalin in the weight ratio of 3:1, respectively, is used as the alkali-soluble resin.

The additive used was a combination of a novolak resin having a polystyrene-converted weight-average molecular weight of 850 obtained through a distillation and a fractionation from a novolak resin having a polystyrene-converted weight-average molecular weight of 350 which was produced by the reaction of m-cresol with formalin; and 4,4'-(2-hydroxybenzylidene) di-2,6-xylenol in the weight ratio of 1:3, respectively.

The quinonediazide compound used was a condensation reaction product of 2,3,4,4'-tetrahydroxybenzophenone and 1,2-naphthoquinonediazide-5-sulfonic chloride in the molar ratio of 1:2.5, respectively.

10.93 parts of said novolak resin, 3.4 parts of said additive and 4.8 parts of said quinonediazide compound were dissolved in 47.5 parts of the solvents having the composition shown in Table 2. The solution thus prepared was filtered through a 0.2 μm-fluororesin filter to obtain a resist liquid. This liquid was coated onto a silicon wafer, previously rinsed according to an ordinary manner, with a spin coater so as to make film having thickness after drying of 1.28 μm. After being baked for 60 sec. on a hot plate of 90° C., the silicon wafer was exposed to light by using a reduced projection aligner using the exposure light having the wavelength of 436 nm (g-line) [manufactured by NIKON K.K- "NSR-1505G3C", NA=0.42] while stepwise changing the exposure dose. The silicon wafer was then developed for 1 min by using developer "SOPD" [manufactured by SUMITOMO CHEMICAL INDUSTRY CO.] to obtain a positive pattern. All the positive patterns thus obtained were evaluated according to the following procedure. The results are shown in Table 2.

γ-value and Sensitivity (Eth): the normalized film thickness (=residual film thickness/initial film thickness) was plotted in relation to the logarithm of the exposure dose. From the plotted line, the gradient θ was obtained and γ-value was tanθ. Sensitivity (Eth) was the exposure dose where the normalized film thickness was equal to 0 on the plotted line.

Profile: a 0.7-μm line-and-space pattern was exposed to light and the sectional form of the pattern after development was observed through a scanning electron microscope. The exposure dose was such that the line-and-space pattern became 1:1 at the bottom width (b) as shown in FIG. 1. For index showing the quality of the profile, the line width (a) of the top plane of the line-and-space pattern was measured.

Resolution: dimension of the smallest line-and-space pattern which was obtained by being exposed to light at an exposure dose where a 1.0-μm line-and-space pattern became 1:1 and can be resolved without film thickness loss was measured by a scanning electron microscope.

Figure 1:
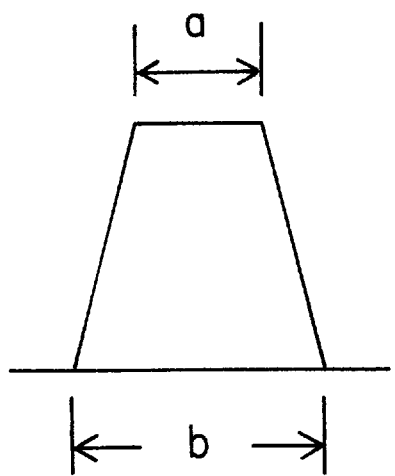
FIG. 1

This is a schematic cross-sectional drawing of the profile observed in the examples.

What we claim is:

1. A positive-working resist composition comprising
   (A) an effective amount of a quinonediazidesulfonic acid ester of a hydroxybenzophenone compound represented by the following general formula (I)

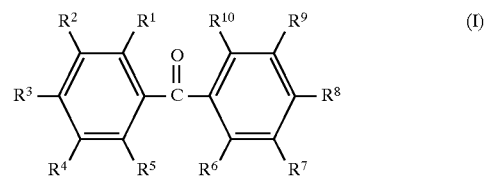

wherein two groups among R1, R2, R3, R4, R5, R6, R7, R8, R9 and R10 represent a hydroxyl group and the others each independently represent a hydrogen atom or a hydroxyl group;
   (B) an effective amount of an alkali-soluble resin; and
   (C) an effective amount of a solvent system including 2-heptanone, ethyl lactate and γ-butyrolactone,
wherein the amount of γ-butyrolactone is 1.0% by weight or more and the amount of ethyl lactate is 10% by weight or more on the basis of the total amount of the solvent system (C).

2. A composition according to claim 1 which comprises 2-heptanone and ethyl lactate in an amount of 50% by weight or more in total on the basis of the total amount of the solvent system (C).

3. A composition according to claim 1, wherein the total amount of quinonediazidesulfonic acid ester (A) and the alkali-soluble resin (B) are present in an amount of 3–50% by weight on the basis of the total amount of the resist composition.

TABLE 2

| | | Resist Characteristics | | | |
|---|---|---|---|---|---|
| Example No. | Solvent Components and their Weight Ratio | E th (msec.) | γvalue | Profile (nm) | Resolution (μm) |
| Example 8 | 2-HP 90/EL 0.5/GBL 9.5 | 160 | 2.0 | 193.4 | 0.65 |
| Example 9 | 2-HP/90/EL 1/GBL 9 | 160 | 2.0 | 234.4 | 0.65 |
| Example 10 | 2-HP 77.5/EL 20/GBL 2.5 | 150 | 2.0 | 228.5 | 0.65 |
| Example 11 | 2-HP 80/EL 10/GBL 10 | 155 | 2.2 | 316.4 | 0.65 |
| Example 12 | 2-HP 60/EL 20/GBL 20 | 140 | 2.5 | 304.9 | 0.65 |
| Example 13 | 2-HP 46/EL 27/GBL 27 | 135 | 2.5 | 316.4 | 0.65 |
| Example 14 | 2-HP 33/EL 33/GBL 33 | 140 | 2.3 | 240.2 | 0.65 |
| Example 15 | 2-HP 20/EL 40/GBL 40 | 130 | 2.4 | 281.2 | 0.65 |
| Example 16 | 2-HP 10/EL 45/GBL 45 | 130 | 2.3 | 293.0 | 0.65 |
| Comparative example 7 | 2-HP 90/EL 10 | 160 | 1.9 | 0 | 0.65 |

In the positive-working resist composition of the present invention, the quinonediazide compound exhibits a excellent solubility and the positive-working resist composition is excellent in various characteristics such as sensitivity, profile and coatability.

4. A composition according to claim 1, wherein the amount of 2-heptanone is 10% by weight or more on the basis of the total amount of the solvent system (C).

* * * * *